(12) United States Patent
Mizobuchi

(10) Patent No.: US 7,430,307 B2
(45) Date of Patent: Sep. 30, 2008

(54) DATA PROCESSING APPARATUS

(75) Inventor: Koji Mizobuchi, Sagamihara (JP)

(73) Assignee: Olympus Corporation, Tokyo (JP)

( * ) Notice: Subject to any disclaimer, the term of this patent is extended or adjusted under 35 U.S.C. 154(b) by 672 days.

(21) Appl. No.: 10/954,036

(22) Filed: Sep. 29, 2004

(65) Prior Publication Data

US 2005/0073391 A1   Apr. 7, 2005

(30) Foreign Application Priority Data

Oct. 2, 2003   (JP) .............................. 2003-344931

(51) Int. Cl.
*G06K 9/00*   (2006.01)
(52) U.S. Cl. .................. 382/124; 382/305; 713/186
(58) Field of Classification Search ................. 382/124, 382/116, 115, 117, 118, 305, 313; 348/5.5, 348/77, 78, 160, 161, 207, 213, 220, 232, 348/333, 552, 14.01, E7.079, E5.042; 713/182, 713/186; 379/93.03, 110.01; 455/411; 726/17
See application file for complete search history.

(56) References Cited

U.S. PATENT DOCUMENTS 5,247,497 A * 9/1993 Cohn ....................... 369/26.01
5,781,651 A * 7/1998 Hsiao et al. ................. 382/127
6,038,333 A * 3/2000 Wang ......................... 382/118
6,067,624 A * 5/2000 Kuno ........................... 726/17
6,076,165 A * 6/2000 Maenza ....................... 726/29
6,341,170 B2 * 1/2002 Ikebata et al. ............... 382/116
6,433,818 B1 * 8/2002 Steinberg et al. ............ 348/161
6,990,453 B2 * 1/2006 Wang et al. .................. 704/270

FOREIGN PATENT DOCUMENTS

JP   2000-352998   12/2000

* cited by examiner

*Primary Examiner*—Sheela C Chawan
(74) *Attorney, Agent, or Firm*—Straub and Pokotylo; John C. Pokotylo

(57) ABSTRACT

A data processing apparatus is capable of performing at least one of recording operation and playback operation of at least one of image data and audio data. The data processing apparatus includes a storage section for storing identifiers for identification of predetermined operators and fingerprint data of the operators. The identifiers and the fingerprint data are associated with each other. The apparatus further includes an image pickup device for detecting a fingerprint of each operator, an operation section for selecting one of the identifiers stored in the storage section, a fingerprint comparing section for performing comparison to determine whether or not the fingerprint detected by the image pickup device is identical to fingerprint data associated with the identifier selected by the operation section, and a controller for controlling the enabling and disabling of a predetermined operation in accordance with a result of the comparison performed by the fingerprint comparing section.

6 Claims, 13 Drawing Sheets

DATA PROCESSING APPARATUS

CROSS-REFERENCE TO RELATED APPLICATION

This application claims benefit of Japanese Application No. 2003-344931 filed in Japan on Oct. 2, 2003, the contents of which are incorporated by this reference.

BACKGROUND OF THE INVENTION

1. Field of the Invention

The present invention relates to data processing apparatuses and, more specifically, to a data processing apparatus having a fingerprint verification function.

2. Description of the Related Art

As is well known, portable audio recording and playback apparatuses (hereinafter referred to as "IC recorders") have been widely put in practical use since the late 1990s. Such an IC recorder converts an audio signal obtained from a speaking person into digital data, stores the digital data in a flash memory serving as a rewritable storage medium, and converts the audio data stored therein into an analog signal for playback. In addition, recently, image-capture-capable IC recorders (i.e., IC recorders with image-capture functions), which can record image data simultaneously with recording of audio, have also been commercially available.

The IC recorders feature the capability of selectively operating operation modes, such as recording, playback, fast-forward, fast-backward, and image-capture, through the operation of predetermined operation switches. For example, when the recording-operation mode is selected, audio data converted into a digital signal and index information (including an address for the audio data, recording date and time, and so on) are stored in an audio-data area and an index-information area which are provided in the flash memory in advance.

File numbers and folder marks are assigned to audio data or image data stored in the flash memory. After recording sound or capturing an image, such file numbers and folder marks facilitate the operator to search for or playback an audio data file or an image data file (which are hereinafter referred to as an "audio file" and an "image file", respectively). As the folders, typically, a plurality of folders, for example, folder A, folder B, and folder C, are provided in order to efficiently classify and manage the files, the number of which continues to increase every time sound is recorded or an image is captured. Further, in order to facilitate the operator to recognize a folder being selected, the IC recorder is devised to pop up a mark indicating the folder on a display device, such as the LCD (liquid crystal display) of the main unit.

When multiple operators share one IC recorder, for example, due to confusion of file numbers, the current operator could mistakenly access an audio file or image file of a third person and could inadvertently playback or erase the file of the third person.

Accordingly, an IC recorder is known which is designed to have a security system to prevent, for example, a third party other than the owner of the IC recorder from operating it unless he/she enters his/her verification number (sign), such as an ID code. For example, Japanese Unexamined Patent Application Publication No. 2000-352998 proposes a technology for disabling an operator's playback operation or erase operation of each file unless a fingerprint associated with an ID number registered in the IC recorder matches a fingerprint of the operator.

SUMMARY OF THE INVENTION

In brief, the present invention provides a data processing apparatus that is capable of performing at least one of recording operation and playback operation of at least one of image data and audio data. The data processing apparatus includes a storage section for storing identifiers for identification of predetermined operators and fingerprint data of the operators. The identifiers and the fingerprint data are associated with each other. The apparatus further includes a CCD for detecting a fingerprint, an operation section for selecting one of the identifiers stored in the storage section, a fingerprint comparing section for performing comparison to determine whether or not the fingerprint data of the fingerprint detected by the CCD is identical to fingerprint data associated with the identifier selected by the operation section, and a system controller for controlling the enabling and disabling a predetermined operation in accordance with a result of the comparison performed by the fingerprint comparing section.

DESCRIPTION OF THE PREFERRED EMBODIMENT

An embodiment of the present invention will be described below with reference to the accompanying drawings. A data processing apparatus in the following embodiment will be described by way of example in conjunction with an image-capture-capable IC recorder.

Figure 1:
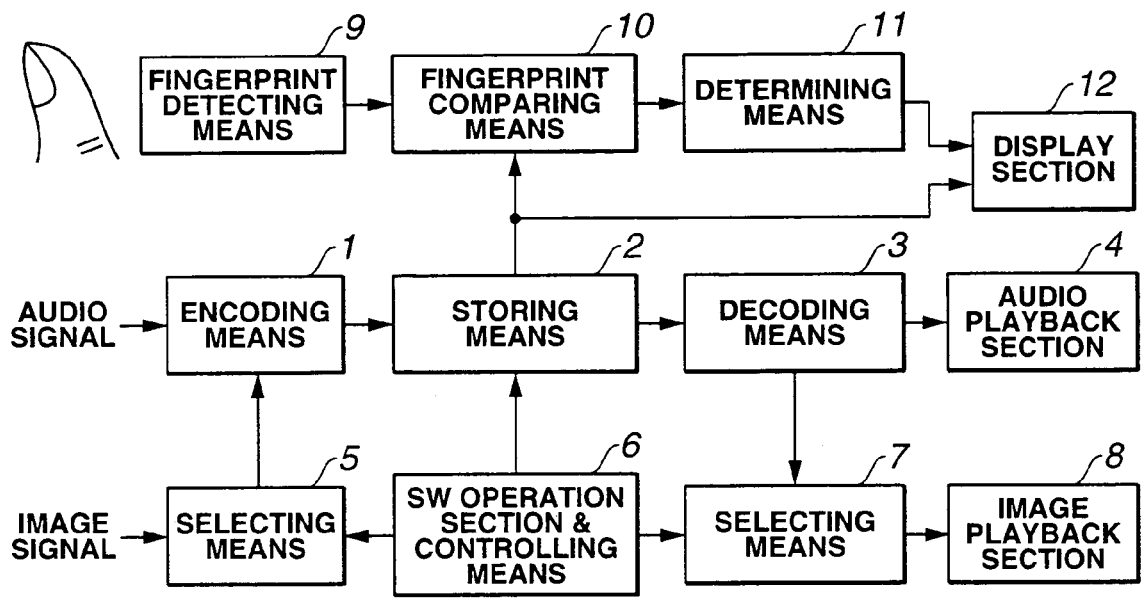
FIG. 1 is a functional block diagram schematically showing the configuration of an image-capture-capable IC recorder according to one embodiment of the present invention.

FIG. 1 is a functional block diagram schematically showing the configuration of an image-capture-capable IC recorder according to one embodiment of the present invention.

As shown in FIG. 1, an image-capture-capable IC recorder 72 of the present embodiment includes encoding means 1 and switch (SW) operation section and controlling means 6. The encoding means 1 encodes an audio signal and an image signal into audio data and image data in predetermined formats, respectively. The SW operation section and controlling means 6 includes a switch operation section (hereinafter referred to as a "SW operation section"), which has a plurality of operation switches, and controlling means for executing a predetermined sequence in response to an input through the operation switches.

The image-capture-capable IC recorder 72 further includes selecting means 5. Only when a particular switch of the SW operation section and controlling means 6 is operated during audio recording, the selecting means 5 inputs image data to the encoding means 1.

The image-capture-capable IC recorder 72 further includes storing means 2 for performing operation for storing the audio data and image data associated with the audio data, identifier information (hereinafter referred to as "IDs") for identification of registered operators (hereinafter referred to as "intended operators") which will be described below, fingerprint data of the intended operators associated with the IDs, and passwords entered by the operators.

The image-capture-capable IC recorder 72 further includes decoding means 3, audio playback section 4, an image playback section 8, and selecting means 7. During playback, the decoding means 3 decodes the audio data and the image data, read from the storing means 2, into an audio signal and an image signal in accordance with predetermined decoding formats, respectively. The audio playback section 4 plays back the decoded audio signal as sound. The image playback section 8 plays back the decoded image signal as an image. The selecting means 7 selectively outputs only an image signal associated with the audio signal to the image playback section 8.

The image-capture-capable IC recorder 72 further includes fingerprint detecting means 9, fingerprint comparing means 10, determining means 11, and a display section 12. The fingerprint detecting means 9 detects a fingerprint of the operator. The fingerprint comparing means 10 compares the data of the operator's fingerprint detected by the fingerprint detecting means 9 with the data of the intended operators' fingerprints pre-registered in the storing means 2. The determining means 11 determines whether or not an intended operator selected based on the result of the comparison performed by the fingerprint comparing means 10 matches the current operator. During the comparison with the intended operators' fingerprint data, the display section 12 displays a list of the names of the intended operators.

Thus, the major sections of the image-capture-capable IC recorder 72 are constructed as described above.

Figure 2:
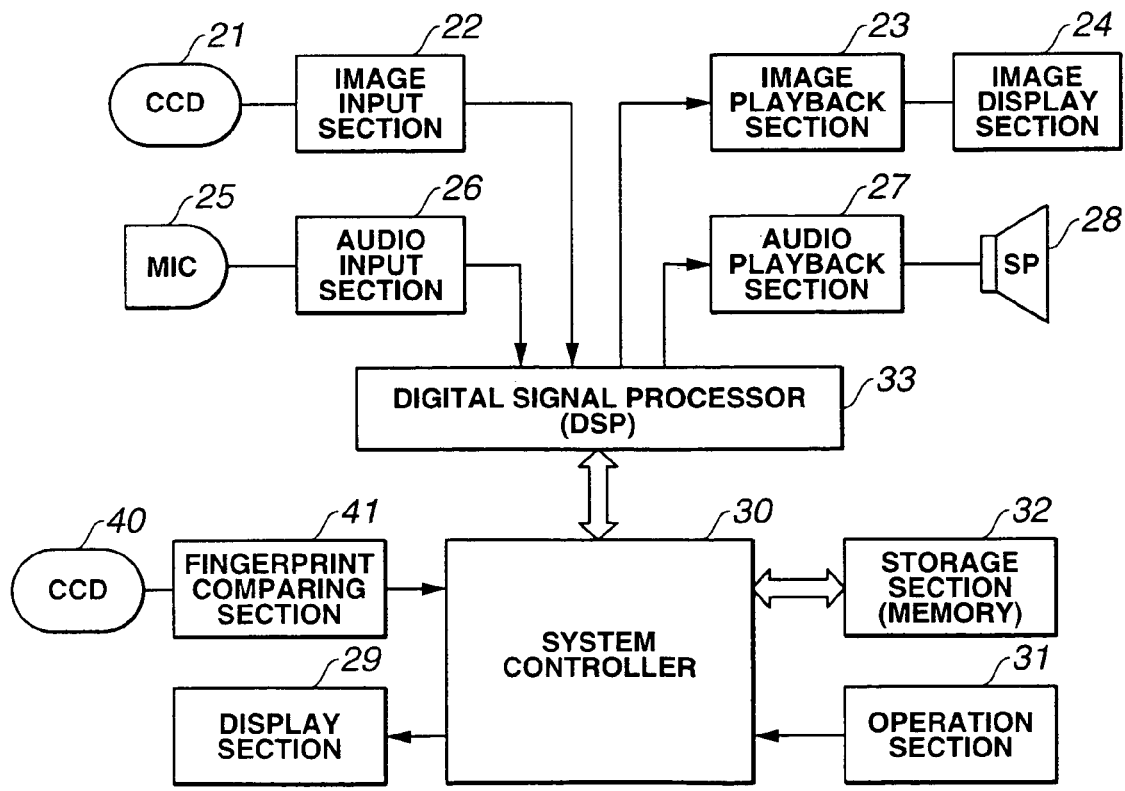
FIG. 2 is a block diagram showing the configuration of a specific circuit and so on of the image-capture-capable. IC recorder shown in FIG. 1.

FIG. 2 is a block diagram showing the structure of a specific circuit and so on of the image-capture-capable IC recorder 72 shown in FIG. 1.

As shown in FIG. 2, an output end of a microphone (MIC) 25, which converts sound into an electrical signal, is connected to an input end of an audio input section 26. An output end of the audio input section 26 is connected to an input end of a digital signal processor (DSP) 33.

Further, an output end of the digital signal processor 33 is connected to an input end of an audio playback section 27. An output end of the audio playback section 27 is connected to an input end of a speaker (SP) 28.

Similarly, an output end of an image pickup device (CCD) 21, which converts an image into an electrical signal, is connected to an input end of an image input section 22. An output end of the image input section 22 is connected to an input end of the digital signal processor (DSP) 33.

Further, the output end of the digital signal processor 33 is connected to an input end of an image playback section 23. An output end of the image playback section 23 is connected to an input end of an image display section 24, which includes, for example, a TFT (thin-film transistor) LCD.

An audio output from the microphone (MIC) 25 is input to the audio input section 26. The audio input section 26 includes a microphone amplifier, a low-pass filter, and analog-to-digital (A/D) converter, any of which is not shown. The microphone amplifier amplifies the audio signal, the low-pass filter eliminates an unwanted frequency band, and then the A/D converter converts the resulting signal into a digital signal.

Similarly, an image output from the image pickup device (CCD) 21 is input to the image input section 22. The image input section 22 includes various control circuits and an A/D converter, which are not shown. For example, the control circuits control an iris, gain, and white balance. Pixel signals output from the image pickup device (CCD) 21 are converted by the image input section 22 into a digital signal.

The digital audio signal and the digital image signal are input to the digital signal processor (DSP) 33. During audio recording, under the control of a system controller 30 described below, the digital signal processor 33 encodes, i.e., compresses, the digital audio signal and the digital image signal into audio data and image data in predetermined encoding formats, respectively, for each frame. The encoded data are temporarily stored in a buffer memory (not shown) of the system controller 30.

On the other hand, during playback, under the control of the system controller 30, the digital signal processor (DSP) 33 decodes, i.e., decompresses, audio data and image data in the buffer memory (not shown) of the digital signal processor (DSP) 33 frame by frame. A decoded digital audio signal is input to the audio playback section 27. The audio playback section 27 includes a digital-to-analog (D/A) converter, a low-pass filter, and a power amplifier (any of which is not shown). The D/A converter converts an input digital audio signal into an analog audio signal, the low-pass filter eliminates an unwanted frequency band, and then the power amplifier amplifies the resulting audio signal. Thereafter, the audio signal is output as sound from the speaker (SP) 28.

Similarly, a decoded digital image signal is input to the image playback section 23. The image playback section 23 includes a video control circuit and a D/A converter (which are not shown). The image playback section 23 converts a digital image signal into an analog image signal, which is then displayed as an image at the image display section 24, which includes, for example, a TFT LCD.

The digital signal processor 33 is connected to the system controller 30, which is implemented by a CPU or the like to control the entire apparatus. The system controller 30 is, in turn, connected to a storage section (memory) 32 that serves as storing means and password storing means, an operation section 31, a display section 29, and a fingerprint comparing section 41. The fingerprint comparing section 41 is connected to an image pickup device (CCD) 40, which serves as fingerprint detecting means for optically detecting ridges and furrows of the operator's fingerprint and converting the detected image into an electrical signal.

The storage section (memory) 32 is implemented by a nonvolatile semiconductor memory, such as a flash memory, and includes a plurality of folders for storing at least one of image data and audio data. During audio recording, audio data and image data, which are encoded by the digital signal processor 33, are stored in the folders of the storage section 32 via the buffer memory (not shown) of the system controller 30. At the same time, index information regarding the audio data and the image data is stored. Further, the operator stores IDs for identifying intended operators and fingerprint data associated with the IDs. Also stored are passwords used for registration of the fingerprint data and operation-environment setting data, which is described below, for respective IDs.

The operation section 31 includes operation switches for controlling various corresponding functions. Examples of the operation switches include a record switch (REC), a playback switch (PLAY), a stop switch (STOP), a fast-forward switch (FF), a fast-backward switch (REW), a menu switch (MENU), a hold switch (HOLD), and a release switch (REL). The operation section 31 provides selecting means and password inputting means. When a scroll bar 62 described below is moved, the selecting means selects any of the IDs stored in the storage section 32. The password inputting means is used by the operator to input his/her password for registration of the fingerprint data.

When the operator operates any of the switches of the operation section 31, the display section 29 displays an operation mode when a predetermined sequence is started or the subsequent operational state. For example, when the record switch (REC) is pressed, the display section 29 displays the elapsed time of recording, recordable remaining time, a file number, intended-operators' names, and so on. When the menu switch (MENU) is pressed, the display section 29 displays information associated with the selection of functions, such as microphone sensitivity (high/low), an audio-recording mode (standard/long), and an alarm (on/off). Further, when the system controller 30 has a clock function, the display section 29 displays the current date and time. Such information can also be displayed at the image display section 24.

The fingerprint comparing section 41 compares the data of the operator's fingerprint detected by the image pickup device (CCD) 40 with the data of intended operators' fingerprints that are pre-registered in the storage section 32.

Figure 3:
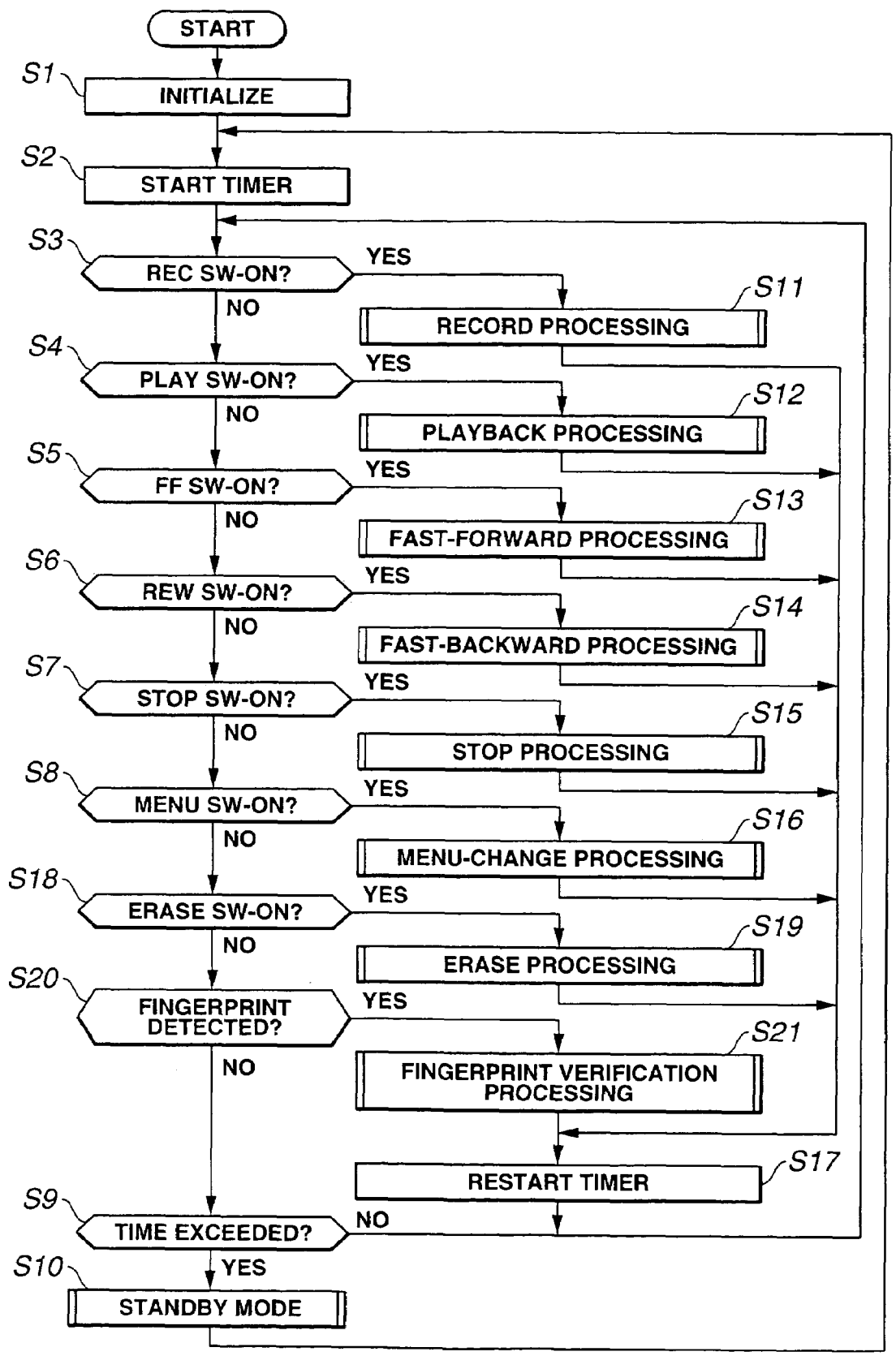
FIG. 3 is a flowchart schematically showing processing for a main operation of the image-capture-capable IC recorder shown in FIGS. 1 and 2.

The operation of the image-capture-capable IC recorder will now be described with reference to FIG. 3. FIG. 3 is a flowchart schematically showing processing for a main operation of the image-capture-capable IC recorder shown in FIGS. 1 and 2.

As shown in FIG. 3, when the image-capture-capable IC recorder is powered on, the system controller 30 shown in FIG. 2 performs predetermined initialization in step S1, and the process proceeds to step S2. In step S2, a timer is started and the process proceeds to step S3. After a predetermined time elapses, the timer clocks time for the image-capture-capable IC recorder to enter a standby mode (a low-consumption current mode) from a normal operation mode.

When the image-capture-capable IC recorder 72 enters the operation mode, in steps S3 to S8 and S18, the system controller 30 determines whether or not each of the switches of the operation section 31 is turned on in the order of the record switch (REC), the playback switch (PLAY), the fast-forward switch (FF), the fast-backward switch (REW), the stop switch (STOP), the menu switch (MENU), and an erase switch (ERASE). Each time it is determined that the switch is turned on, the process branches from that step to the corresponding one of steps S11, S12, S13, S14, S15, S16, and S19, in which predetermined subroutines, i.e., "record processing", "playback processing", "fast-forward processing", "fast-backward processing", "stop processing", "menu-change processing", and "erase processing", are executed respectively.

After executing the subroutines described above, the system controller 30 restarts the timer in step S17 and then the process returns to the main loop. The series of switch detection operations in steps S3 to S8 and S18 after the timer is started in step S2 is enabled, only when the operator is recognized and identified in a fingerprint-verification processing subroutine in step S21 subsequent to the operator's fingerprint detection in step S20.

Each of the fast-forward processing, fast-backward processing, stop processing, menu-change processing, and erase processing is performed by means of a well-known technique. Since those types of processing are not directly relevant to the features of the present invention, the detailed descriptions thereof are omitted.

When all of the switches are turned off in steps S3 to S8 and S18, the process proceeds to step S9, in which a determination is made as to whether the time clocked by the timer exceeds a predetermined time. When it is determined that the time does not exceed the predetermined time, the process proceeds to the main flow, which begins at step S3. When the time exceeds the predetermined time, the process returns to step S10, in which the operation enters a standby-mode subroutine and thus the apparatus is put into a low-consumption current state.

Specifically, the system controller 30, performs control so as to shut down the power supply for the audio input section 26, the image input section 22, the audio playback section 27, the image playback section 23, the image display section 24, the digital signal processor 33, the display section 29, and the storage section 32 shown in FIG. 2. Alternatively, the system controller 30 outputs a non-selection signal to a chip enable terminal provided at an IC (not shown) included in each of those sections. As a result, the apparatus is put into the low-consumption current state.

At this point, the CPU of the system controller 30 switches its own operation clock to a low-speed clock which consumes minimum current, so that the apparatus is put into the low-consumption current state. In some cases, the arrangement may be such that the operation clock is switched from a main clock (e.g., 9.28 MHz) to a sub clock (e.g., 32.768 kHz) and then the main clock is completely stopped until it is detected that any of the switches is turned on. In the standby mode, when any of the operation switches is operated, the operation clock is switched back to the main clock and the process returns to step S2.

Figure 4:
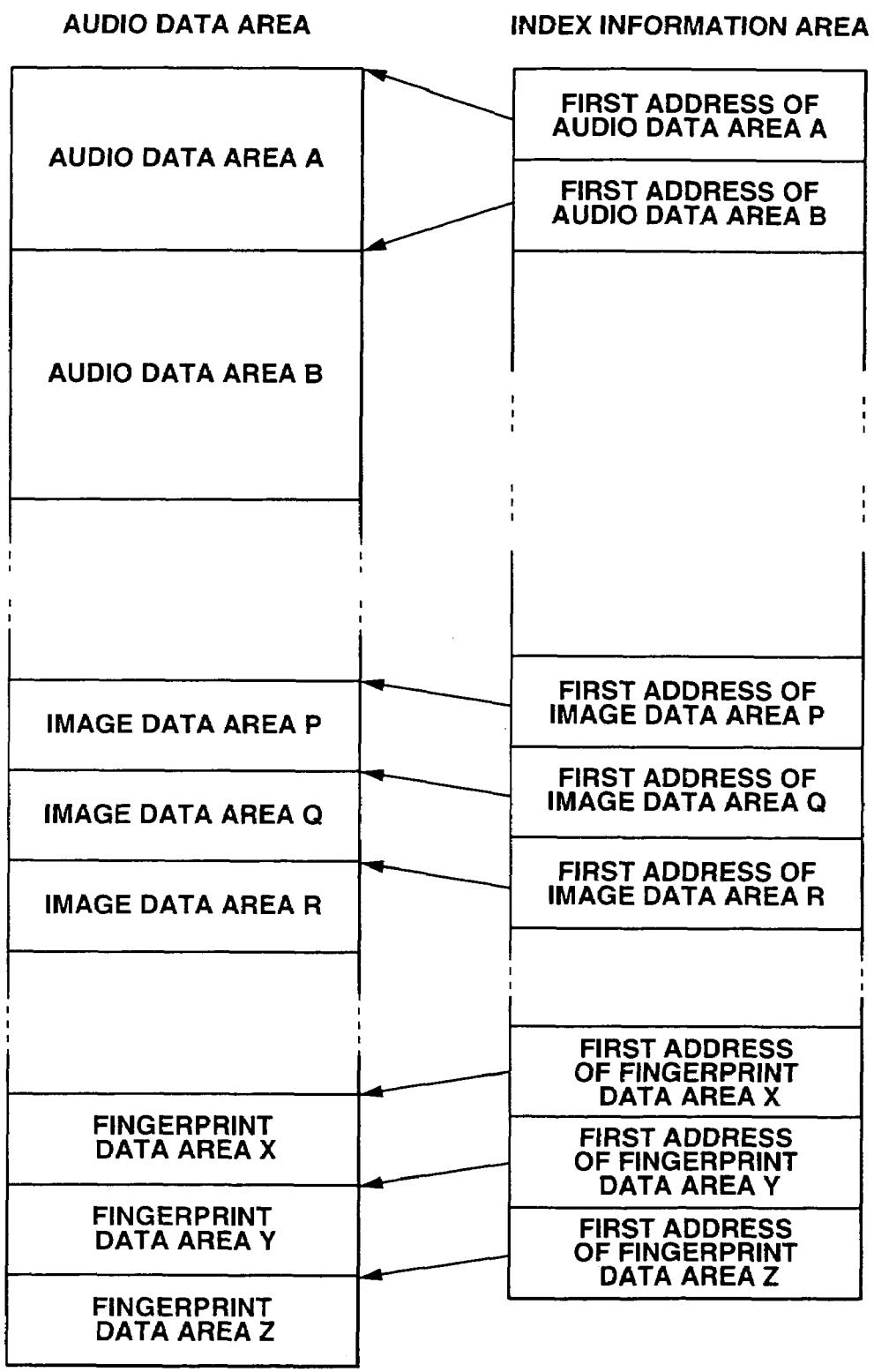
FIG. 4 shows the structures and the relationship of an audio-data area and an index-information area which are stored in a storage section shown in FIG. 2.
Figure 5:
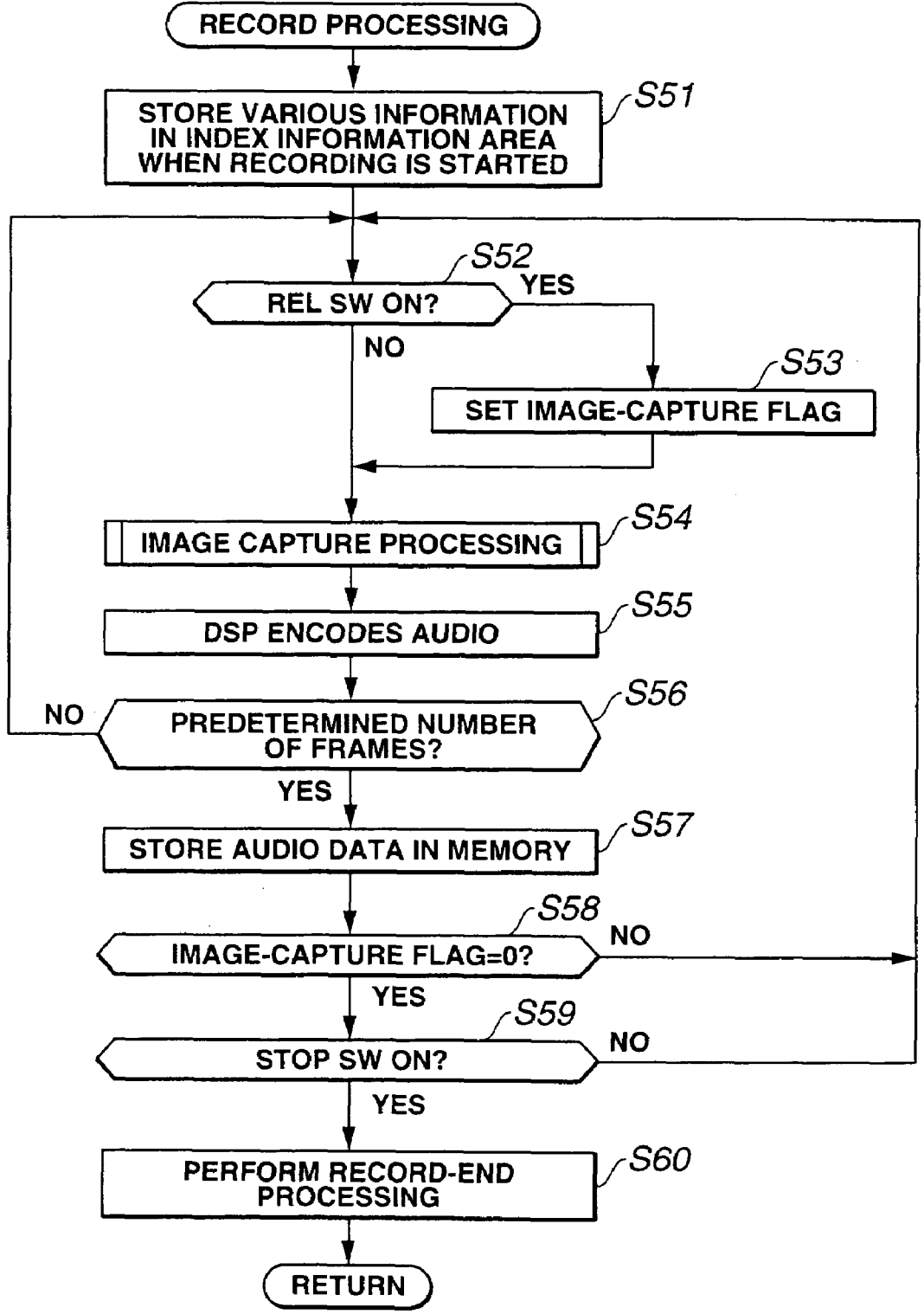
FIG. 5 is a flowchart illustrating details of the record processing operation shown in FIG. 3.

The "record processing" in step S11 of the above predetermined subroutines will now be described with reference to FIGS. 2 and 4 and the flowchart of FIG. 5. FIG. 4 shows the structures and the relationship of an audio-data area and an index-information area which are stored in the storage section 32 in FIG. 2. FIG. 5 is a flowchart illustrating details of the record processing operation shown in FIG. 3.

Referring to FIG. 5, when recording is started, first, in step S51, the system controller 30 stores various types of information in the index-information area in the storage section 32. Examples of the stored information include microphone sensitivity (high/low), an audio-recording mode (standard/ long), a file number, and the start address of an audio data storage area in which the audio data is stored. Thereafter, the process proceeds to step S52.

In step S52, the system controller 30 determines whether or not the release switch (REL) of the operation section 31 (see FIG. 2) is turned on during the audio recording. When the release switch (REL) is turned on, the process branches to step S53. In step S53, the system controller 30 sets the image-capture flag and the process proceeds to the step S54. On the other hand, when the release switch (REL) is off in step S52, the process proceeds to step S54.

In step S54, the system controller 30 executes a subroutine for image-capture processing. The above-noted release switch is equivalent to a release switch (REL) 73 described below. Subsequently, the process proceeds to step S55.

In step S55, the system controller 30 controls the digital signal processor (DSP) 33 to decode an audio signal. Since the decoding is performed for each frame in this case, the digital signal processor 33 continuously decodes the audio signal until the number of frames of audio data reaches a predetermined value. Thereafter, the process proceeds to step S56.

In step S56, the system controller 30 determines whether or not the number of frames of audio data, stored in the buffer memory (not shown) of the system controller 30, reaches the predetermined value. When the number of frames of audio data reachs the predetermined value, the process proceeds to step S57. In step S57, the system controller 30 stores the audio data so that the audio data are written sequentially from the start address of the audio data storage area in the storage section 32. For example, when audio data obtained by encoding an audio signal of 10 bits/frame to audio data of 4 bits/frame is written to the storage section 32 in units of 512 bytes, the predetermined number of frames is 1024.

As shown in FIG. 4, for audio data stored in the storage section 32, audio-data area A and audio-data area B are stored sequentially from, for example, the first address of the audio-data area. Start addresses corresponding to audio-data area A and audio-data area B are stored in the index-information area as the first address of audio-data area A and the first address of audio-data area B, respectively. Similarly, every time an audio-data area is allocated for, for example, audio-data area C, audio-data area D, . . . and so on, the first address of each audio-data area is stored in the index-information area. After the audio data is stored in the storage section 32, the process proceeds to step S58.

In step S58, the system controller 30 determines whether or not the image-capture flag, described below, is "0", i.e., is reset. When the image-capture flag is reset, the system controller 30 controls the digital signal processor 33 so as to cause encoding of the audio signal and encoding of an image signal, which will be described later, in parallel. That is, in order to ensure that a audio interruption does not occur at the time of taking a picture, the system controller 30 causes audio data and image data to be alternately stored in the storage section 32 for each predetermined number of frames. Thereafter, the process proceeds to step S59. On the other hand, when the image-capture flag is not reset in step S58, the process returns to step S52, so that the image-capture processing subroutine is repeated.

After an image is captured, in accordance with the predetermined release-sequence operation in steps S52 to S58 described above, the system controller 30 repeatedly executes each step, until the stop switch (STOP) is turned on in step S59. In step S59, when it is detected that the stop switch (STOP) is turned on, the process proceeds to step S60, in which record-end processing is executed to end the audio-recording and then the process returns.

Of the above-described predetermined subroutines, the "image-capture processing" in step S54 will now be described with reference to FIGS. 2 and 4 and the flowchart of FIG. 6.

Figure 6:
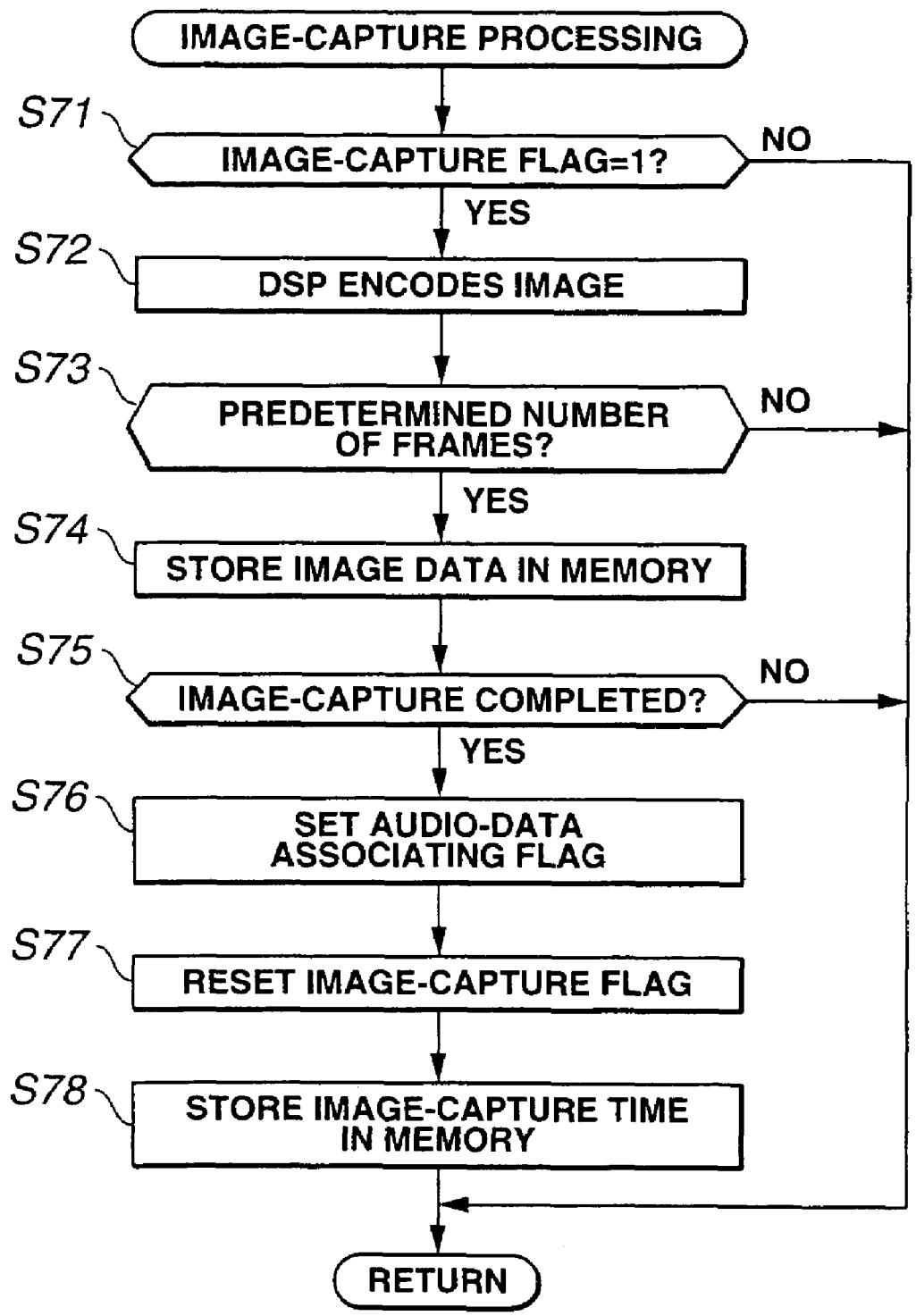
FIG. 6 is a flowchart illustrating details of the image-capture processing operation shown in FIG. 5.

FIG. 6 is a flowchart illustrating details of the image-capture processing operation shown in FIG. 5.

First, in step S71, the system controller 30 detects whether or not the image-capture flag is "1", i.e., is set. When the flag is not set, the ordinary audio-recording process is executed. When the flag is set, this indicates that an image pickup operation is performed. Thus, the process proceeds to step S72, in which the system controller 30 controls the digital signal processor 33 to encode a captured-image, signal. The encoding is performed for each frame as in the case of audio data, and the encoding is continuously performed until the number of frames of image data reaches a predetermined value. Subsequently, in step S73, the system controller 30 determines whether or not the number of frames of image data, stored in the buffer memory (not shown) of the system controller 30, reaches the predetermined value. When the number of frames reaches a predetermined value, the process proceeds to step S74. In step S74, the system controller 30 causes the image data to be written and stored sequentially from the start address of the image data storage area in the storage section 32.

As shown in FIG. 4, the start address of the image-data area is stored, for example, sequentially from an arbitrary address of the audio-data area. Further, a start address corresponding to image-data area P, a start address corresponding to image-data area Q, and a start address corresponding to image-data area R are stored in the index-information area as the first address of image-data area P, the first address of image-data area Q, and the first address of image-data area R, respectively. As in the case of the audio data described above, the image data is also stored such that, every time an image-data area is allocated, the first address of each image-data area is stored in the index-information area.

Steps S71 to S74 are repeatedly performed until the image capture is completed. After the image capture is completed in step S75, the system controller 30 sets an audio-data associating flag in step S76 and then the process proceeds to step S77. In step S77, the system controller 30 resets the image-capture flag and then the process proceeds to step S78. In step S78, the system controller 30 stores the image-capture time in the storage section 32 and ends this subroutine. On the other hand, when it is determined in step S75 that the image capture is not completed, the process returns to the previous routine.

In this case, the resetting of the image-capture flag in step S77 corresponds to step S58 shown in FIG. 5. The above-noted audio-data associating flag will be described in detail in image playback processing described below.

Next, the "playback processing" in step S12 shown in FIG. 3 will be described with reference to FIG. 2 and the flowchart of FIG. 7.

Figure 7:
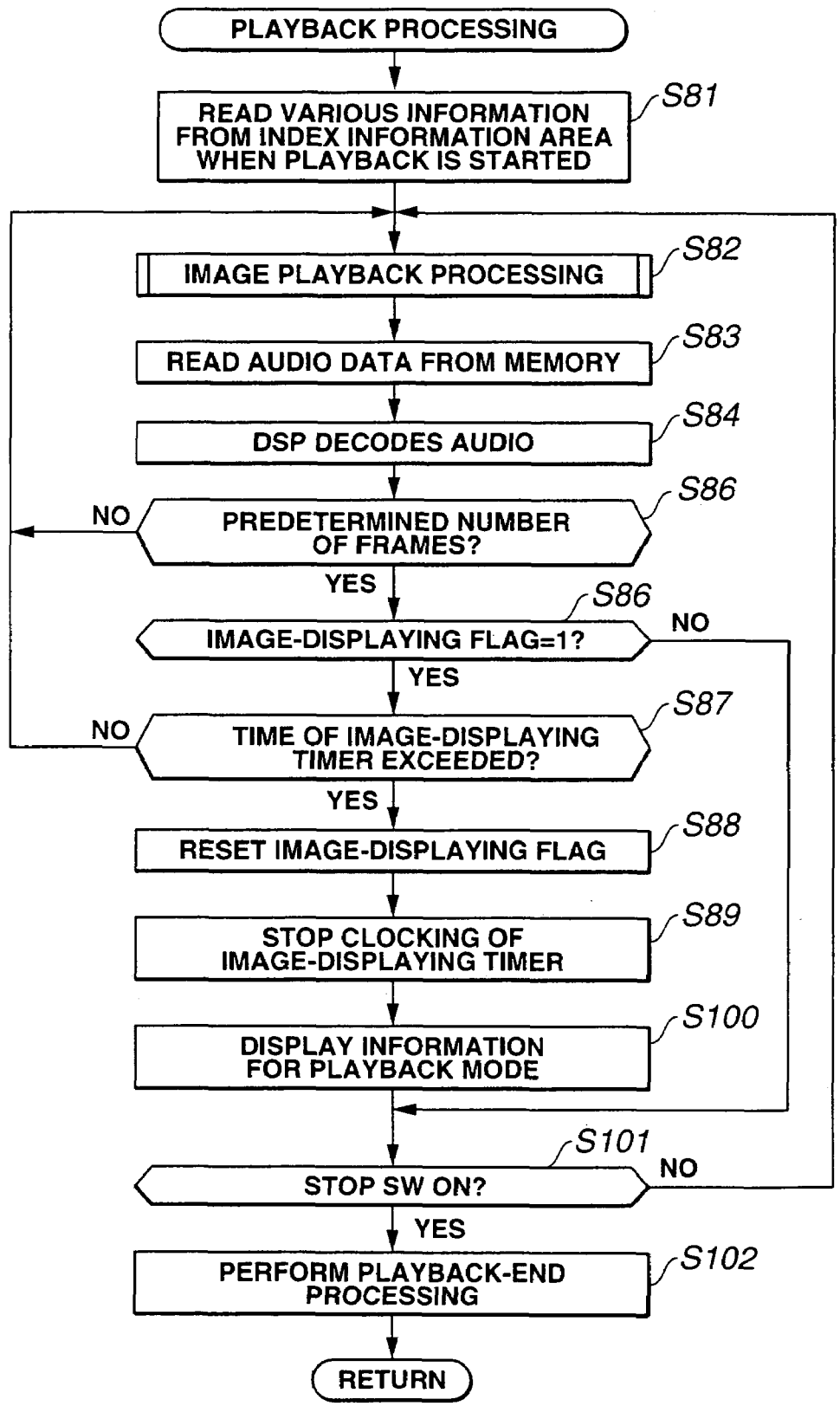
FIG. 7 is a flowchart illustrating details of the playback processing operation shown in FIG. 3.

FIG. 7 is a flowchart illustrating details of the playback processing operation shown in FIG. 3. When the playback of audio is started, first, in step S81, the system controller 30 reads various types of information from the index-information area in the storage section 32. Examples of the read information include a selected recording-mode (standard/long) related to an audio-data area, a file number, and the start address of the audio data storage area in which the audio data is stored. After the reading, the process proceeds to step S82.

In step S82, the system controller 30 executes a subroutine for image-playback processing and the process proceeds to step S83. In step S83, the system controller 30 reads the audio data stored in the storage section 32 sequentially from the start address of the audio data storage area, and then the process proceeds to step S84.

In step S84, the system controller 30 controls the digital signal processor 33 to decode the audio data. The decoding is performed for each frame, and thus the decoding is continuously performed until the number of frames of audio data reaches a predetermined value. While sequentially storing the decoded audio data in the buffer memory (not shown) of the system controller 30, the system controller 30 outputs the data as audio signals to the audio playback section 27. Thereafter, the process proceeds to step S85.

In step S85, the system controller 30 determines whether or not the decoding of the audio data has completed for a predetermined number of frames. When the decoding is completed for the predetermined number of frames, the process proceeds to step S86. In step S86, the system controller 30 checks the state of an image-displaying flag. When the image-displaying flag is "1", i.e., is set, the system controller 30 display a corresponding image on the display section 29 shown in FIG. 2 at the same time when audio playback is started. The process then proceeds to step S87.

In general, during audio (voice) playback, a few seconds after the image display is started is sufficient for the speaking person to be recognized. Thus, in step S87, the system controller 30 determines whether or not an image-displaying timer, which starts clocking in image-playback processing described below, clocks a predetermined time and exceeds the predetermined time. When the time does not exceed the predetermined time, steps S82 to S86 described above are repeatedly performed.

When the time exceeds the predetermined time in step S87, the process proceeds to step S88. In step S88, the system controller 30 resets the image displaying flag and the process proceeds to step S89. In step S89, the system controller 30 stops the clocking of the image-displaying timer and then the process proceeds to step S100. In step S100, the system controller 30 displays information for the ordinary playback mode. Examples of the information include an audio-recording time, a playback elapsed time, an audio-recording mode (standard/long), and a file number. Thereafter, the process proceeds to step S101.

Steps S82 to S86 described above are repeatedly performed until the stop switch (STOP) is turned on in step S101. When the stop switch (STOP) is turned on in step S101, the process proceeds to step S102, in which the system controller 30 executes playback-end processing to end the playback and then the process returns.

Next, of the above predetermined subroutines, the "image playback process" in step S82 will be described with reference to FIG. 2 and the flowchart of FIG. 8.

Figure 8:
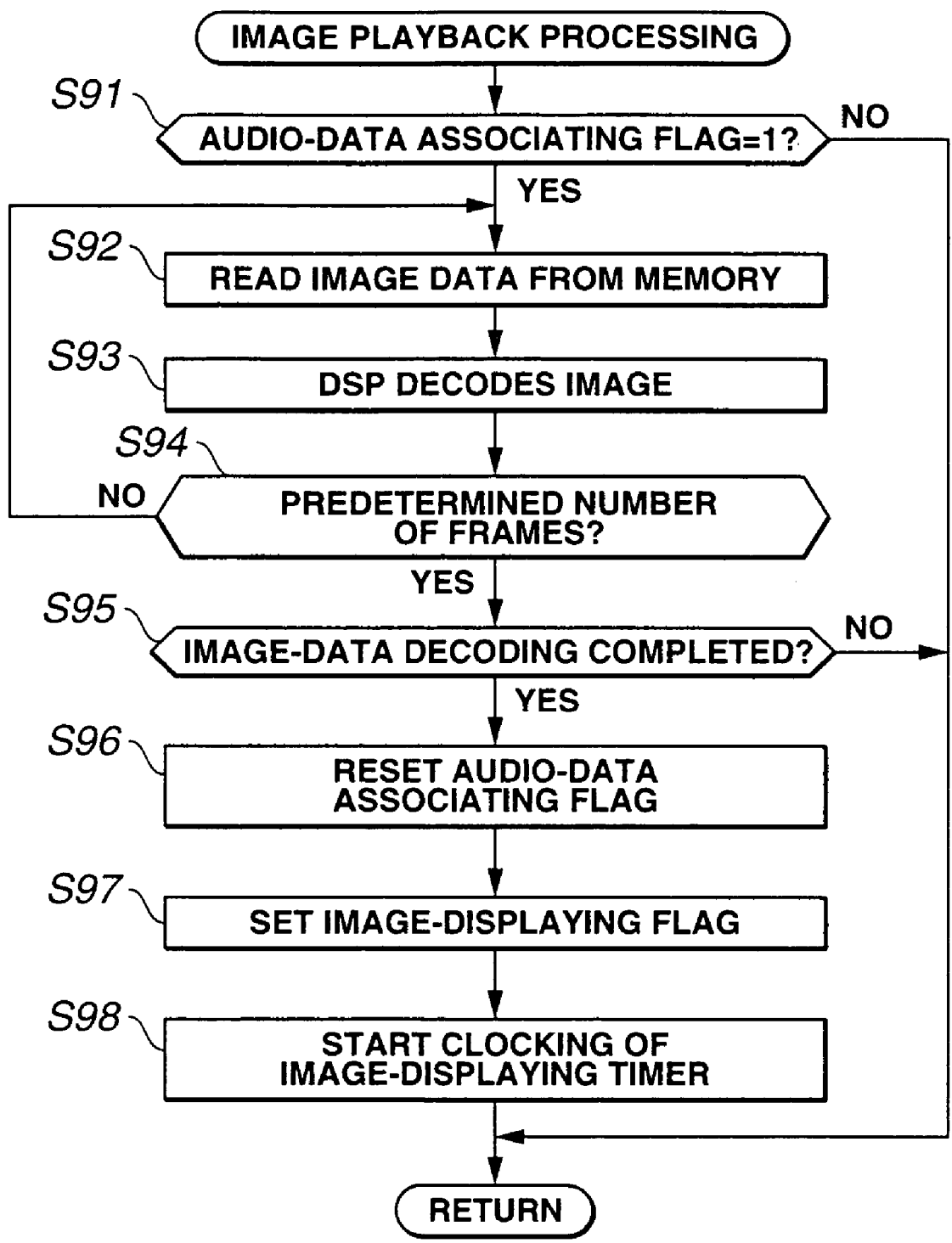
FIG. 8 is a flowchart illustrating details of the image-playback processing operation shown in FIG. 7.

FIG. 8 is a flowchart illustrating details of the image playback processing operation shown in FIG. 7. First, in step S91, the system controller 30 detects whether or not the audio-data associating flag is "1", i.e., is set. When the flag is not set, the system controller 30 executes the ordinary playback processing shown in FIG. 7 to decode only audio data. When the flag is set, the process proceeds to step S92. In step S92, the system controller 30 reads image data stored in the storage section (memory) 32 sequentially from the start address of the image data storage area. Subsequently, in step S93, the system controller 30 controls the digital signal processor 33 to decode the read image data.

The decoding is performed for each frame as in the case of the audio data. Thus, in step S94, the system controller 30 determines whether or not the number of frames of image data reaches a predetermined value. When the number of frames reaches the predetermined value, the system controller 30 outputs the decoded image data to the image playback section 23 (see FIG. 2) as an image signal, while sequentially storing the image data in the buffer memory (not shown) of the system controller 30. Thereafter, the process proceeds to step S95.

Steps S91 to S94 described above are repeatedly performed until the decoding of the image data is completed. In step S95, the system controller 30 determines whether or not the decoding of the image data is completed. When the decoding of the image data is completed, the process proceeds to step S96. In step S96, the system controller 30 resets the audio-data associating flag. Subsequently, in step S97, the system controller 30 sets the image-displaying flag. Then, in step S98, the system controller 30 starts clocking of the image-displaying timer and the process ends. In step S96, after the audio-data associating flag is reset, the system controller 30 performs the ordinary audio-playback processing for decoding only audio data based-on the audio-data associating flag determined in step S91.

Figure 9:
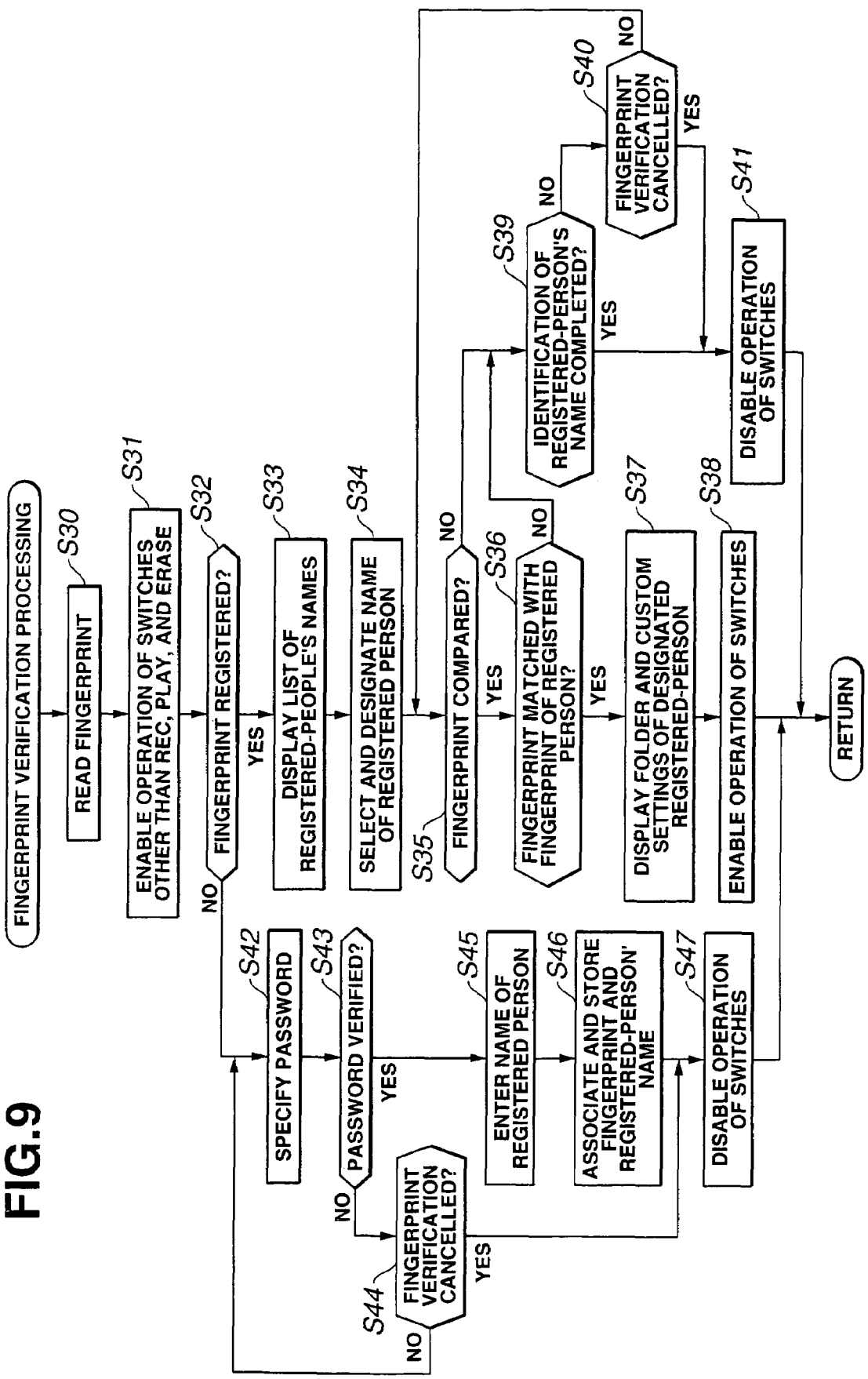
FIG. 9 is a flow chart illustrating details of the fingerprint-verification processing operation shown in FIG. 3.
Figure 10:
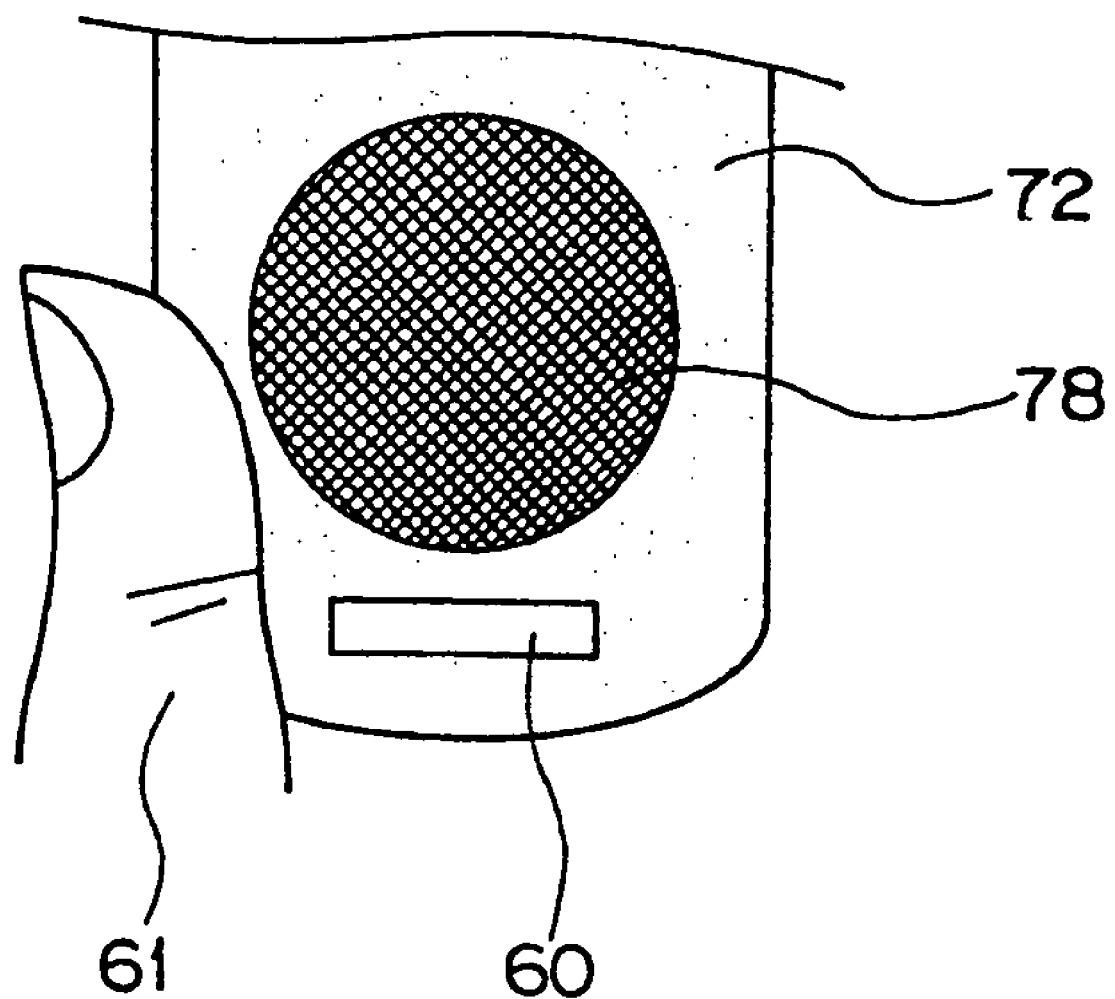
FIG. 10 is a partial front view showing the lower portion of the image-capture-capable IC recorder (shown in FIG. 1) which is provided with a linear CCD.
Figure 11:
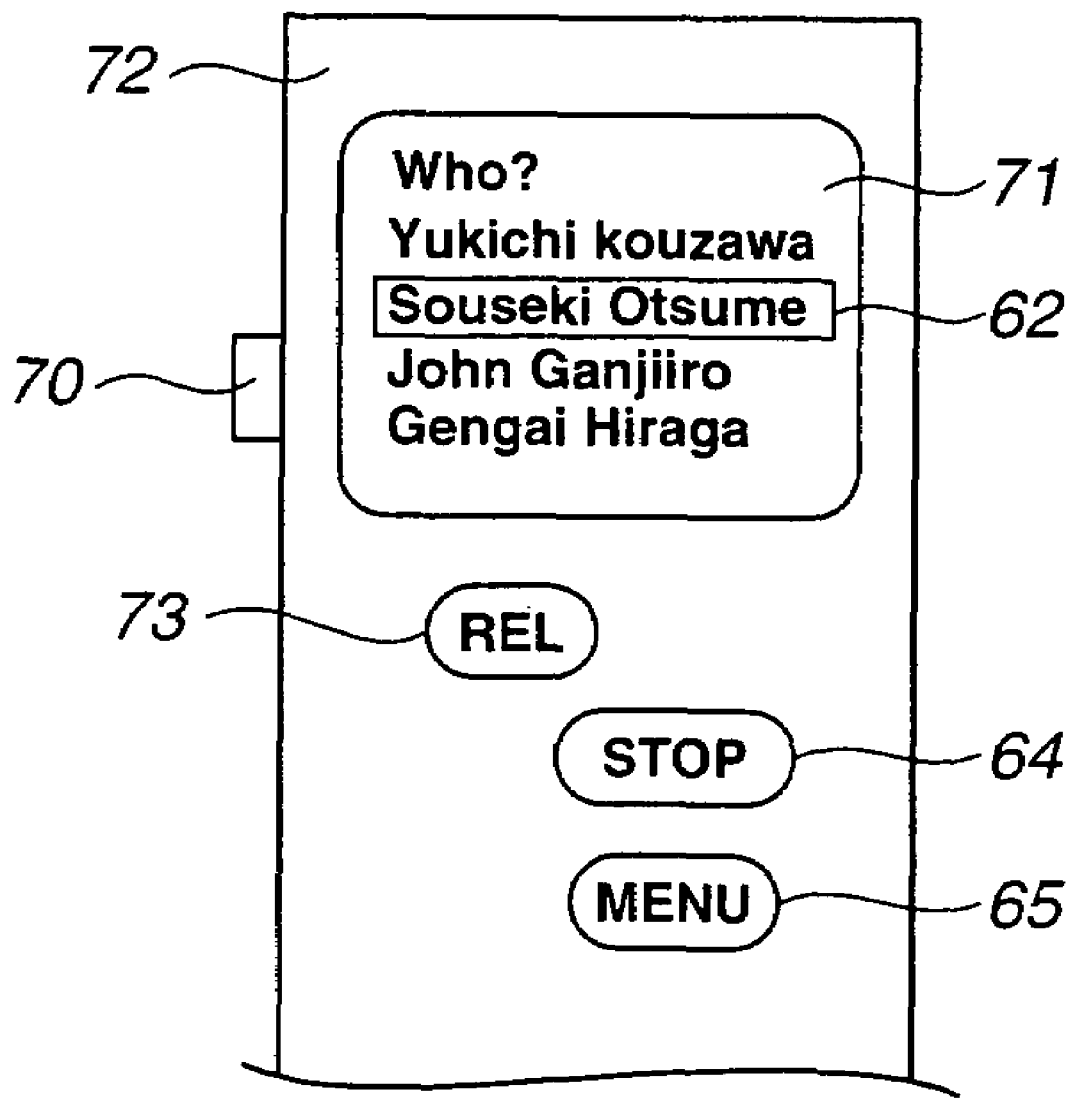
FIG. 11 is a partial front view showing the upper portion of the image-capture-capable IC recorder shown in FIG. 1.

Next, the "fingerprint verification processing" in step S21 shown in FIG. 3 will be described with reference to the flow chart of FIG. 9 and FIGS. 2, 4, 10, and 11. FIG. 9 is a flow chart illustrating details of the fingerprint verification processing operation shown in FIG. 3. FIG. 10 is a partial front view showing the lower portion of the image-capture-capable IC recorder (shown in FIG. 1) which has a linear CCD. FIG. 11 is a partial front view showing the upper portion of the image-capture-capable IC recorder shown in FIG. 1.

As shown in FIG. 10, the image pickup device (CCD) 40 (see FIG. 2) in the fingerprint detecting section is provided, for example, on a surface of the lower portion of the image-capture-capable IC recorder 72. The image pickup device (CCD) 40 is implemented by a linear CCD 60 or the like, which is low-cost and small-sized fingerprint-detecting means. In this case, stroking the outer surface of the linear CCD 60 at a constant speed allows the linear CCD 60 to read a fingerprint of the operator. That is, as shown in FIG. 10, slowly moving the ball of a finger 61 in contact with the outer surface of the linear CCD 60 causes the linear CCD 60 to convert variations in light reflected from ridges and furrows of a fingerprint into an electrical signal, thereby reading the fingerprint.

As a specific example, a "hollow roll head system" is available which was co-disclosed by Alps Electric Co., Ltd. and Casio Computer Co., Ltd. on Feb. 25, 2003. The system realizes the optical reading with still higher accuracy and higher reliability and has a shape that is most readily applicable to the fingerprint detecting section of the image-capture-capable IC recorder of the present embodiment.

The reading of a fingerprint may be automatically triggered by a brightness variation caused when the linear CCD 60 is shaded by the ball of the finger 61 of the operator.

As shown in FIG. 9, first, in step S30, the system controller 30 uses the linear CCD 60 to read a fingerprint of the operator and to convert a read image into image data. In step S31, in order to allow the operator to perform key entry for fingerprint registration or password designation which is described below, the system controller 30 enables the operation of switches other than the record switch (REC), the playback switch (PLAY), and the erase switch (ERASE). Thereafter, the process proceeds to step S32.

In step S32, the system controller 30 determines whether or not a fingerprint of the operator has been registered. When a fingerprint of the operator has not been registered, the process branches to step S42. In step S42, the operator operates a menu switch (MENU) 65 (see FIG. 11) to select a password entry mode. The operator then specifies a multi-digit password, which is constituted by numbers and alphabets, assigned to each IC recorder. The password is then recognized by the system controller 30. Entry of the password makes it possible to prevent a malicious third party from easily registering a fingerprint. Thereafter, the process proceeds to step S43.

In step S43, when a password has been previously registered by the operator, the system controller 30 determines whether or not the password entered in step S42 matches the password pre-registered in the storage section 32. Alternatively, when a password has not been registered by the operator, the system controller 30 determines whether or not the password entered in step S42 is the same as a password registered by a third party or whether or not the password is valid. When the password is verified or is determined to be valid, the process proceeds to step S45.

In step S45, the system controller 30 recognizes that the operator enters the name of a registered person. In this case, when the operator has previously entered the registered-person's name and his/her password, the system controller 30 checks whether there is no error in the registered-person's name and the process proceeds to step S46.

In step S46, for example, when a stop switch (STOP) 64 (see FIG. 11) is turned on, the system controller 30 associates the fingerprint, read in step S30 and converted into image data, with the name of the registered person and stores (registers) the fingerprint and the name of the registered person in the storage section 32 (see FIG. 2). Subsequently, the process proceeds to step S47, in which the system controller 30 disables the operation of the switches and ends the fingerprint verification.

Accordingly, the system controller 30 provides password comparing means and registration-operation controlling means. More specifically, the password comparing means compares a password entered through the operation section 31 with a password stored in the storage section 32. When the comparison of the passwords indicates that the password entered through the operation section 31 is identical to the password stored in the storage section 32, the registration-operation controlling means performs control so as to enable the registration of the operator's fingerprint into the storage section 32. When the comparison indicates that the passwords are different from each other, the registration-operation controlling means performs control so as to disable the registration of the operator's fingerprint into the storage section 32.

The system controller 30 further provides registering means for converting the operator's fingerprint detected by the image pickup device 40 into image data, associating the image data with the ID, and registering the image data in the storage section 32.

As shown in FIG. 4, an intended operator's fingerprint is stored in the storage section 32 such that the start address of a fingerprint-data area is stored, for example, sequentially from the last address of the audio-data area. Further, start addresses corresponding to fingerprint-data area X, fingerprint-data area Y, and fingerprint-data area are Z stored in the index-information area as the first address of fingerprint-data area X, the first address of fingerprint-data area Y, and the first address of fingerprint-data area Z, respectively. As in the audio data described above, every time a fingerprint-data area is assigned to the fingerprint data, the first address of each fingerprint-data area may be stored in the index-information area.

Returning to step S43, when the password entered in step S42 is not verified, i.e., when the password entered by the operator, for example, through multiple attempts, is different from the password pre-registered by the operator, the process branches to step S44. In step S44, the system controller 30 determines whether to forcibly cancel the fingerprint verification. When the fingerprint verification is to be cancelled or when the fingerprint verification is forcibly cancelled by turning on the stop switch (STOP) 64 (see FIG. 11), the process proceeds to step S47. In step S47, the system controller 30 disables the operation of the switches and terminates the fingerprint verification.

Returning to step S32, when the operator's fingerprint has been registered, the process proceeds to step S33. In this case, for recording and playback operations, when the operator operates the menu switch (MENU) 65 (see FIG. 11) the system controller 33 causes a list of registered-people's names, which serve as IDs, to be displayed on the display section 29 (see FIG. 2). Thereafter, the process proceeds to step S34.

In step S34, the system controller 30 recognizes that the operator has selected and designated a name used for the registration, out of the list of registered-people's names displayed on the display section 29. Specifically, the system controller 30 recognizes the following operator's operation. That is, the operator operates, for example, a fast-forward switch (FF) to move a scroll bar 62, which serves as a selecting means, and operates the stop switch (STOP) 64 to select and designate only one registered person's name, for example, "Souseki Otsume" out of the registered-people's names displayed on an LCD 71 shown in FIG. 11. Thereafter, the process proceeds to step S35.

In step S35, the system controller 30 performs fingerprint comparison, for example, when the stop switch (STOP) 64 is turned on. Specifically, the system controller 30 controls the fingerprint comparing section 41 to compare the operator's fingerprint read by the linear CCD 60 in step S30 with a fingerprint associated with a registered person's name stored in the storage section 32. In step S36, when the fingerprints match each other, i.e., when features of the fingerprint images match each other, the process proceeds to step S37. In step S37, the system controller 30 determines that the verified operator is to perform operation and causes the folder and the custom settings of the identified registered person to be displayed on the LCD 71. Subsequently, in step S38, the system controller 30 ends the fingerprint verification, while leaving the operation of the switches in the enabled state.

That is, the system controller 30 controls the fingerprint verification section 41 to determine whether or not the operator's fingerprint detected by the image pickup device 40 is identical to an operator's fingerprint data associated with the ID selected by the operator with the scroll bar 62, described below. When it is determined that they are identical, the system controller 30 enables the recording operation and/or the playback operation, which are predetermined operations for image data and/or audio data. When it is determined they are not identical, the system controller 30 disables the recording operation and/or the playback operation, which are predetermined operations for image data and/or audio data. That is, the system controller 30 provides controlling means in the present invention and thus controls the enabling and disabling of a predetermined operation.

The folder and the custom settings of the registered person identified are different from those of another registered person. For example, in the folder of registered person A, only an audio file recorded by registered person A is stored. Thus, when operator A is operating the apparatus, he or she can neither playback nor erase an audio file of registered person B.

With respect to custom settings for operation-environment setting data that can be arbitrarily configured by a user when image data and/or audio data is stored, only a corresponding operator can change the settings. Examples of the operation-environment setting data include folder information, microphone sensitivity information, and alarm setting information. In accordance with the operation-environment setting data for the ID, the system controller 30 controls the enabling and disabling of use of a plurality of folders for storing images and/or audio in the storage section 32, when the recording operation and/or the playback operation for image data and/or audio data is enabled. That is, the system controller 30 provides operation-environment setting means.

On the other hand, when the fingerprint comparison is not performed in step S35 or when the fingerprint in question does not match the fingerprint of the registered person in step S36, the process branches to step S39. In step S39, the system controller 30 determines whether to terminate the identification of the registered-person's name. When the identification is not to be terminated, the process branches to step S40. In step S40, the system controller 30 determines whether to cancel the fingerprint verification. When it is determined in step S40 that the fingerprint verification is to be cancelled or it is determined in step S39 that the identification of the registered-person's name is to be terminated, the process proceeds to step S41. In step S41, the system controller 30 uses a scheme similar to that in step S47 described above to disable the operation of the switches, and terminates the fingerprint verification.

Since the principles of the fingerprint detection, fingerprint comparison, and fingerprint verification are not directly relevant to the features of the present invention, more detailed description therefor is omitted.

An overview of a method for capturing an image during actual audio-recording will now be described with reference to FIGS. 12 to 14.

Figure 12:
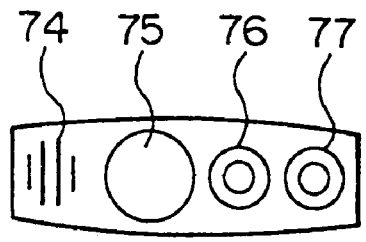
FIG. 12 is a top view of the image-capture-capable IC recorder shown in FIG. 1 to illustrate an overview of taking a picture during audio recording.

FIG. 12 is a top view of the image-capture-capable IC recorder shown in FIG. 1 to illustrate an overview of taking a picture during audio-recording. FIG. 13 is a front view of the image-capture-capable IC recorder. FIG. 14 is a view showing a state in which the image-capture-capable IC recorder is in use.

As shown in FIG. 12, on the top surface of the image-capture-capable IC recorder 72, microphone openings 74, an image pickup lens 75, a microphone jack 76, and an earphone jack 77 are provided in the longitudinal direction. The microphone 25 and the image pickup device 21, which are shown in FIG. 2, are provided in the IC recorder so as to correspond to the microphone openings 74 and the image pickup lens 75, respectively.

Figure 13:
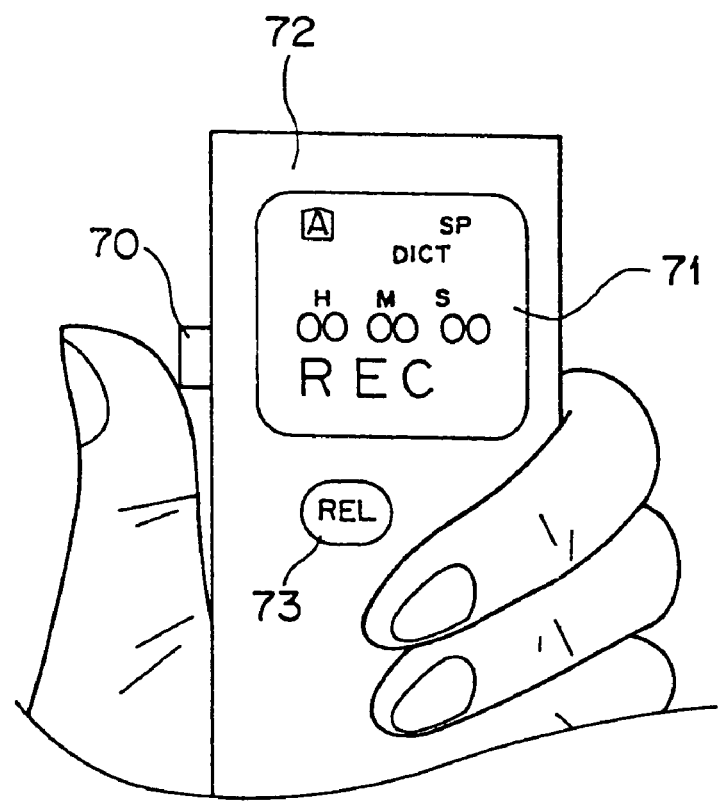
FIG. 13 is a front view of the image-capture-capable IC recorder shown in FIG. 1 to illustrate an overview of taking a picture during audio recording.

As shown in FIG. 13, a release (REL) switch button 73 and the display section 71 are provided at the upper portion of the front surface of the image-capture-capable IC recorder 72. A record switch button 70 is provided on one side surface of the image-capture-capable IC recorder 72.

Other operation switch buttons provided on the image-capture-capable IC recorder 72, which are not particularly shown, are provided on the front surface or side surfaces of the image-capture-capable IC recorder 72 so as to facilitate operations.

Figure 14:
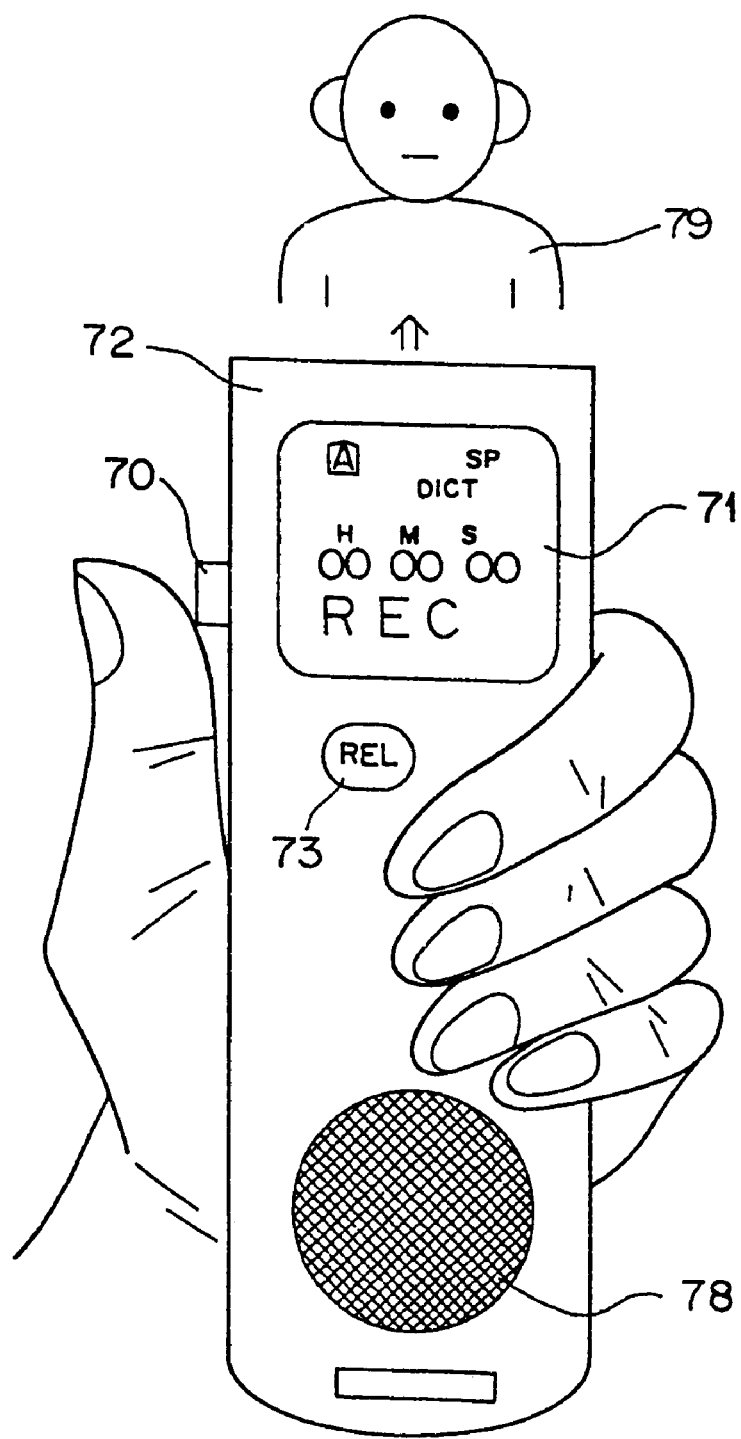
FIG. 14 is a view of a state in which the image-capture-capable IC recorder shown in FIG. 1 is in use to illustrate an overview of taking a picture during audio recording.

Further, as shown in FIG. 14, speaker sound-emitting openings 78 are arranged at the lower portion of the front surface of the image-capture-capable IC recorder 72. The speaker 28, which is shown in FIG. 2, is provided in the IC recorder 72 so as to correspond to the speaker sound-emitting openings 78. In many cases, soft-touch switches, which are commonly referred to as "tactile push switches", are used for the above-described operation switches.

First, pressing the record switch button 70 of the image-capture-capable IC recorder 72 to turn on the record switch causes recording to be started. At this point, an initial view indicating the start of recording is displayed on the display section 71, thereby notifying the operator of a state in which the recording is progress. In this state, as shown in FIG. 14, the operator directs the top surface of the image-capture-capable IC recorder 72 at a person 79 speaking and presses the release switch button 73 to turn on the release switch. As a result, an image of the person 79 can be captured. Image capture is performed every time the release switch is turned on. Thus, for example, even for interviewing a plurality of people speaking, the IC recorder 72 can reliably record respectively images of the people so as to correspond to what they have spoken.

In order to ensure the image recording, an image picked-up by the image pickup lens 75 may be displayed on the display section 71 for a while after the release switch is turned on. After determining the framing of the subject, turning on the release switch again causes image capture to be executed.

An overview of image playback during audio-playback will now be described with reference to FIG. 15.

Figure 15:
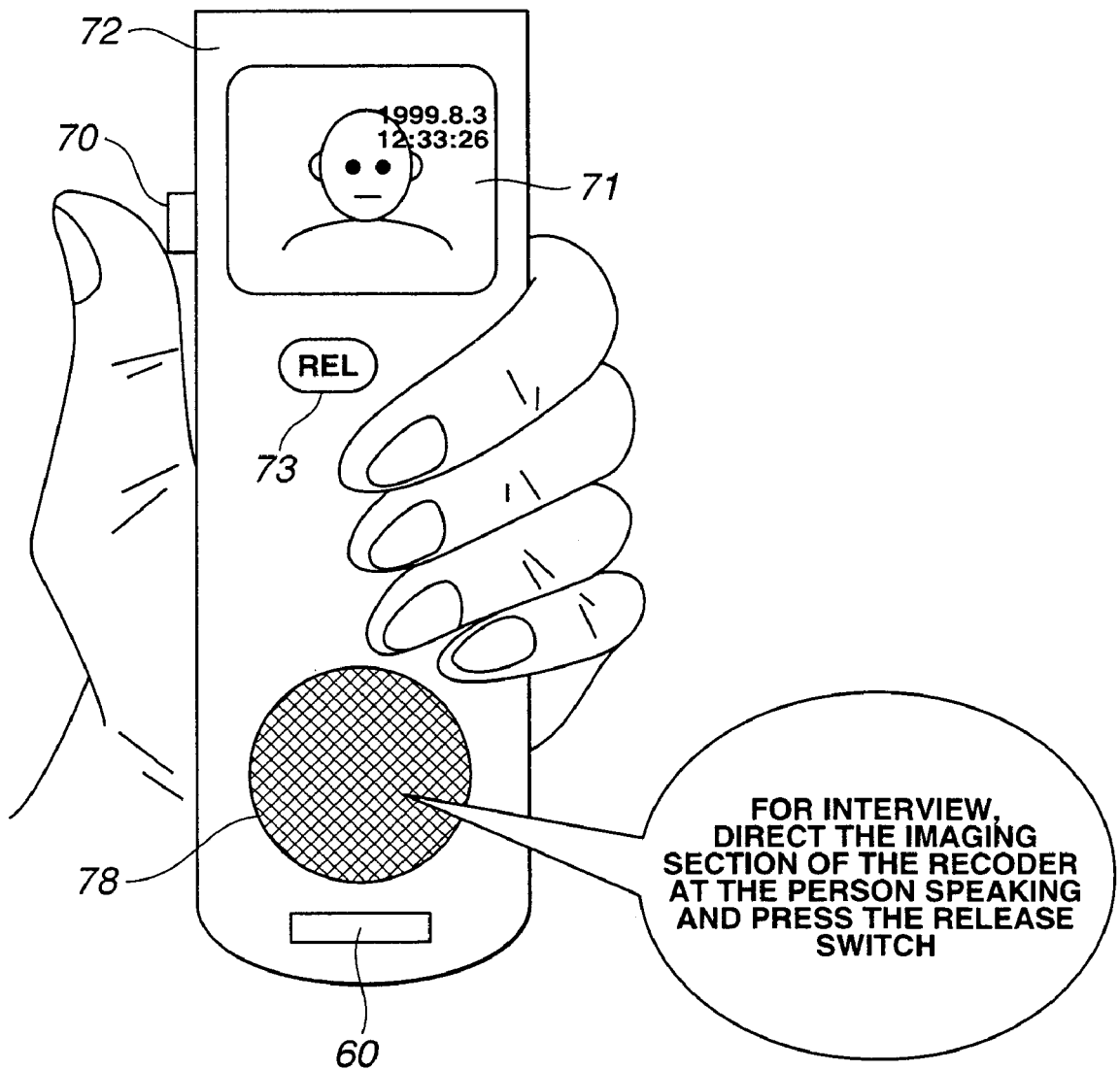
FIG. 15 is a front view of the image-capture-capable IC recorder shown in FIG. 1 to illustrate an overview of image playback during playback.

FIG. 15 is a front view of the image-capture-capable IC recorder 72 to illustrate an overview of image playback during audio-playback.

Pressing a playback switch button (not shown), provided on the front surface or a side surface of the image-capture-capable IC recorder 72, to turn on the playback switch causes a playback operation to be started. Voice as shown in, for example, a balloon in FIG. 15 is output from the speaker sound-emitting openings 78. At the same time, an image of a person speaking associated with the voice is displayed on the display section 71. The image may be displayed until the playback of voice associated with the image is completed. Naturally, the image may be displayed for a certain period of time after the start of playback.

When there is no need to check an image, any image does not have to be displayed. When any image associated with audio is not recorded, information, such as audio-recording time, playback elapsed time, an audio-recording mode (standard/long), and a file number, for the ordinary playback is displayed.

As described above, the image-capture-capable IC recorder 72 according to one embodiment of the present invention has the low-cost and small-sized linear CCD provided on the surface thereof. Thus, using the linear CCD, the system controller 30 detects a fingerprint of the operator and compares the detected operator's fingerprint with a fingerprint associated with a registered-person's name, i.e., an intended-operator's name, stored in the storage section.

When the fingerprints match each other, the system controller 30 determines that the identified operator is to perform operation and thus causes the folder and the custom settings of the identified registered-person to be displayed on the LCD.

The folder and the custom settings of the identified registered person are different from those of another registered person. For example, only audio files recorded by registered person A are stored in the folder of registered person A. Thus, when registered person A is operating the apparatus, he or she cannot playback or erase audio files of registered person B.

With this arrangement, the operator can playback or erase only audio or image files in a folder which have been stored by the operator himself/herself. Thus, even when a large number of files exist in a plurality of folders, the operator can instantaneously recognize which file is enabled and disabled for operation and can easily check the name of a speaker and his/her speech content, thereby providing improved usability. In addition, this arrangement can eliminate the possibility that the current operator mistakenly accesses an audio file or image file of a third person and inadvertently playbacks or erases the file of the third person.

Although the optical linear CCD has been used to read a fingerprint in the illustrated embodiment, the present invention is not limited thereto. For example, the use of a semiconductor electrostatic device that reads a change in the amount of electrical charge at an electrode upon the placement of a finger thereon allows fingerprint detection to be performed in the same manner. Further, when higher cost and larger space are permissible, an area CCD may be used.

In addition, although the data processing apparatus has been described by way of example in conjunction with the image-capture-capable IC recorder, the present invention is not limited thereto. Thus, needless to say, the data processing apparatus may be applied to an IC recorder without an image-capture function and a digital video camera.

Having described the preferred embodiment of the invention referring to the accompanying drawings, it should be understood that the present invention is not limited to those precise embodiment and various changes and modifications thereof could be made by one skilled in the art without departing from the sprint or scope of the invention as defined in the appended claims.

What is claimed is:

1. A data processing apparatus that is capable of performing at least one of recording operation and playback operation of at least one of image data and audio data, the data processing apparatus comprising:
    storing means for storing identifiers for identification of predetermined operators and fingerprint data of the operators, the identifiers and the fingerprint data being associated with each other;
    fingerprint detecting means for detecting a fingerprint;
    selecting means for selecting one of the identifiers stored in the storing means;
    comparing means for performing comparison to determine whether or not fingerprint data of the fingerprint detected by the fingerprint detecting means is identical to fingerprint data associated with the identifier selected by the selecting means; and
    controlling means for controlling enabling and disabling of a predetermined operation in accordance with a result of the comparison performed by the comparing means,
    wherein, when the comparing means determines that the fingerprint data of the fingerprint detected by the fingerprint detecting means is identical to the fingerprint data of the operator associated with the identifier selected by the selecting means, the controlling means enables the predetermined operation and when the comparing means determines that the fingerprint data are not identical, the controlling means disables the predetermined operation, and wherein the storing means further stores operation-environment setting data for each identifier, and the data processing apparatus further comprises operation-environment setting means for setting an operation environment in accordance with the operation-environment setting data for the identifier selected by the selecting means, when the controlling means enables the predetermined operation.

2. The data processing apparatus according to claim 1, wherein the predetermined operation comprises at least one of recording operation and playback operation of at least one of image data and audio data.

3. The data processing apparatus according to claim 1, further comprising registering means for converting the fingerprint detected by the fingerprint detecting means into image data, associating the image data with the identifier, and registering the image data in the storing means.

4. The data processing apparatus according to claim 3, further comprising:
    password storing means for storing a password;
    password inputting means for allowing the operator to enter a password;
    password comparing means for comparing the password stored in the password storing means with the password entered through the password inputting means; and
    registration-operation controlling means for enabling the registering means to perform registration into the storing means, when the password stored in the password storing means is identical to the password entered through the password inputting means, and for disabling the registering means from performing registration into the storing means, when the passwords are not identical.

5. The data processing apparatus according to claim 1, wherein the operation-environment setting data comprises folder information, microphone sensitivity information, or alarm setting information which is arbitrarily configurable by the operator during storage of at least one of image data and audio data.

6. The data processing apparatus according to claim 1, wherein the storing means comprises a plurality of folders for storing at least of image data and audio data; and when the controlling means enables the predetermined operation, the operation-environment setting means controls enabling and disabling of use of each folder, in accordance with the operation-environment setting data for the identifier selected by the selecting means.

* * * * *